(12) United States Patent
Wei et al.

(10) Patent No.: US 11,817,146 B2
(45) Date of Patent: Nov. 14, 2023

(54) PHASE-CHANGE MEMORY

(71) Applicant: Rheinisch-Westfälische Technische Hochschule (RWTH) Aachen, Aachen (DE)

(72) Inventors: Shuai Wei, Aachen (DE); Matthias Wuttig, Aachen (DE); Yudong Cheng, Aachen (DE); Julian Pries, Aachen (DE); Xiaoling Lu, Aachen (DE)

(73) Assignee: Rheinisch-Westfälische Technische Hochschule (RWTH) Aachen, Aachen (DE)

( * ) Notice: Subject to any disclaimer, the term of this patent is extended or adjusted under 35 U.S.C. 154(b) by 203 days.

(21) Appl. No.: 17/608,172

(22) PCT Filed: Apr. 21, 2020

(86) PCT No.: PCT/DE2020/100324
§ 371 (c)(1),
(2) Date: Nov. 2, 2021

(87) PCT Pub. No.: WO2020/228889
PCT Pub. Date: Nov. 19, 2020

(65) Prior Publication Data
US 2022/0215878 A1    Jul. 7, 2022

(30) Foreign Application Priority Data

May 16, 2019    (DE) ..................... 10 2019 112 887.0

(51) Int. Cl.
*G11C 11/00*        (2006.01)
*G11C 13/00*        (2006.01)
*G11C 13/04*        (2006.01)

(52) U.S. Cl.
CPC ...... *G11C 13/0004* (2013.01); *G11C 13/0069* (2013.01); *G11C 13/048* (2013.01); *G11C 2013/0095* (2013.01)

(58) Field of Classification Search
CPC ............ G11C 13/0004; G11C 13/0069; G11C 13/048; G11C 2013/0095
(Continued)

(56) References Cited

U.S. PATENT DOCUMENTS 3,271,591 A    9/1966  Ovshinsky
3,983,542 A    9/1976  Ovshinsky
(Continued)

FOREIGN PATENT DOCUMENTS

DE            2138581 A1     4/1972
DE       102008016522 A1    10/2008
(Continued)

*Primary Examiner* — Vu A Le
(74) *Attorney, Agent, or Firm* — Smartpat PLC

(57) ABSTRACT

A phase-change memory (10) for the non-volatile storage of binary contents stores the binary contents electrically and/or optically in a non-volatile manner by locally switching a material (18) between an amorphous and a crystalline phase. The state with respect to the electrical conductivity of the material (18) and/or the reflection properties of the material (18) determines the information content of the phase-change memory (10). A method for non-volatile storage of binary contents in a phase-change memory (10), which stores the binary contents electrically and/or optically in a non-volatile manner by locally switching a material (18) between an amorphous and a crystalline phase, whereby the state with respect to the electrical conductivity of the material (18) and/or the reflection properties of the material (18) determines the information content of the phase-change memory (10).

10 Claims, 1 Drawing Sheet

(58) Field of Classification Search
USPC .......................................................... 365/148
See application file for complete search history.

(56) References Cited

U.S. PATENT DOCUMENTS

| | | | |
|---|---|---|---|
| 7,848,135 B2 * | 12/2010 | Elmegreen | H10N 70/8822 |
| | | | 29/25.35 |
| 2008/0165569 A1 | 7/2008 | Chen et al. | |
| 2010/0073997 A1 | 3/2010 | Elmegreen et al. | |
| 2010/0309714 A1 * | 12/2010 | Meade | H10N 70/231 |
| | | | 438/795 |
| 2013/0309782 A1 * | 11/2013 | Dubourdieu | H10N 70/801 |
| | | | 438/3 |
| 2015/0154120 A1 | 6/2015 | Guyot et al. | |

FOREIGN PATENT DOCUMENTS

| | | |
|---|---|---|
| DE | 102017208205 A1 | 11/2018 |
| WO | 2016111724 A1 | 7/2016 |

* cited by examiner

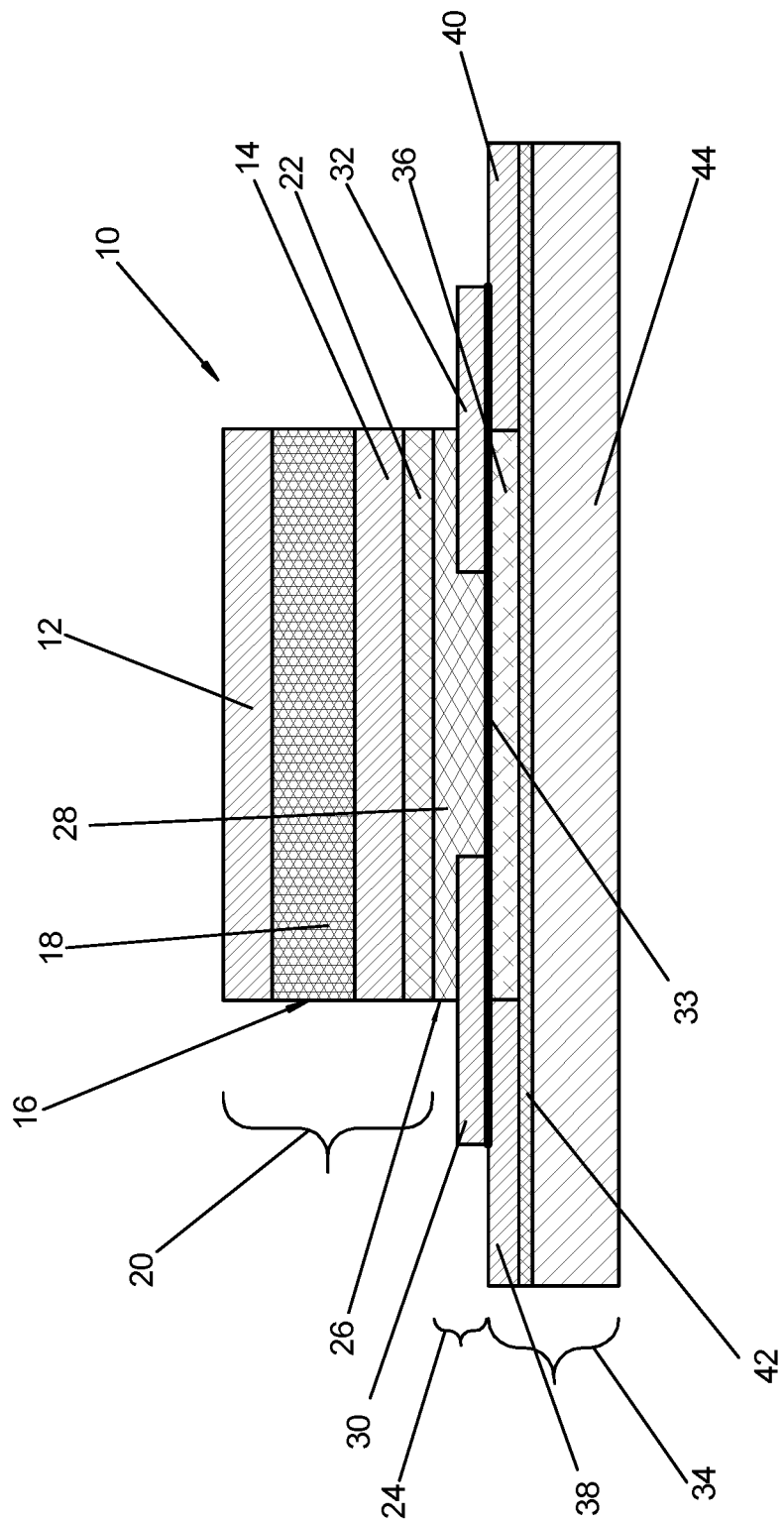

PHASE-CHANGE MEMORY

TECHNICAL FIELD

The invention relates to a phase-change memory for the non-volatile storage of binary content, which stores the information electrically and/or optically in a non-volatile manner by local switching a material between an amorphous and a crystalline phase, wherein the state with respect to the electrical conductivity of the material and/or with respect to the reflective properties of the material determines the information content of the phase-change memory.

The invention further relates to a method for a phase-change memory for the non-volatile storage of binary content, which stores the binary content electrically and/or optically in a non-volatile manner by local switching a material between an amorphous and a crystalline phase, wherein the state with respect to the electrical conductivity of the material and/or with respect to the reflective properties of the material determines the information content of the phase-change memory.

BACKGROUND

Phase-change memories (PCMs) alternate between amorphous and crystalline structures. They can be used, for example, as energy or data storage devices. The phase-change memory is considered here to be a data storage device for binary content or digital information.

A distinction is made between volatile and non-volatile data or working memory in electronic devices such as microprocessor-controlled electronic data processing systems or computers. Volatile memories, such as semiconductor memories with direct access, also referred to as RAM (Random Access Memory), have the property that they lose their stored content as soon as the voltage is switched off. The contents of the memory are therefore only stored temporarily in the memory. In contrast, non-volatile memory such as ROM (Read-Only Memory), EPROM (Erasable Programmable ROM), or EEPROM (Electrically Erasable Programmable ROM) retains its contents even after the voltage has been switched off.

Examples of non-volatile memory also include magnetic data tapes, floppy disks, or hard drives, which store their data electromagnetically on a magnetizable storage medium. Optical storage media that store the data in a non-volatile manner include CDs and DVDs, for example. Flash memory should also be mentioned here as a non-volatile digital semiconductor device. Writing or storing information on such digital storage media always takes a certain amount of time.

The time required to store the information depends in particular on the respective switching times of the storage media. In addition to the material properties themselves, these switching times are also influenced by the temperature, for example. The more or faster switching processes are executed, the more heat is produced by the components, and the switching processes of the memory often become even slower if the heat is not dissipated. Semiconductor components in particular are very temperature-dependent and therefore usually require a great deal of cooling.

Nevertheless, in order to increase the speed of non-volatile storage media, new storage concepts, for example the phase-change memory (PCM) mentioned above, have been developed. Phase-change memories of the type mentioned above are now in series production and are currently used in computers. The Intel Corporation offers such phase-change memories under the brand name "Intel Optane®".

Phase-change memory makes use of the fact that a material has different optical and/or electrical properties in the amorphous and crystalline phase. By applying two electrodes, a current pulse can be applied to the material of the phase-change memory. When a relatively high current pulse is applied to the material, heat is generated so that the crystalline material changes to the amorphous phase. After the end of the pulse, the material cools down very quickly. The material therefore remains in the amorphous state and does not return to the crystalline phase. The conductivity of the material is considerably lower in the amorphous state than in the crystalline state.

The crystalline state is also usually referred to as the "SET" state. The material switches from the amorphous state back to the set, crystalline state by exposing it to a relatively low current pulse for a longer period of time. The process of changing from the amorphous to the crystalline state can thus be reversed via the duration and amplitude of the current pulse. As a result of the longer pulse duration, the amorphous material is heated to a temperature above the crystallization temperature and is maintained at this temperature until crystallization takes place. The material thus forms a memory cell that defines the binary content via its phase state.

To read the information, a voltage that produces a current strength so low that the temperature in the material does not reach the level necessary for a phase change is applied to such a resistive memory cell. Depending on the state, a different current will flow through the cell, which is then used to read the cell. A binary state can thus be defined based on the resistance of the memory cell. The crystalline state is defined to be the "SET state", a binary "one", and the amorphous state is defined to be a binary "zero".

Many such memory cells are used in a non-volatile digital memory for data processing systems with microprocessors.

DE 10 2008 016 522 A1 discloses a memory cell. The memory cell described therein comprises a first electrode and a second electrode. Furthermore, a composite material is provided, whereby the composite material electrically connects the first electrode to the second electrode and contains a phase-change material and a resistor material. At least one part of the phase-change material is able to respond to the application of a switching signal to the first and/or the second electrode so that it is possible to switch between an essentially crystalline phase and an essentially amorphous phase. In this case, the resistor material has a resistivity that is lower than that of the phase-change material when the phase-change material is in the essentially amorphous phase.

Despite the advantages of the known phase-change memories, they have the disadvantage that they are still too slow. What is desired is non-volatile memory that is considerably faster than flash memory, for example. Known phase-change memories such as the 3D Xpoint "Intel Optane®" are considerably faster, but even the fast switching speeds they offer are inadequate in some areas of application. The switching speed of a phase-change memory is limited by its crystallization speed.

SUMMARY

An object of the disclosure is to avoid the disadvantages of the prior art and to create a phase-change memory with considerably shorter switching times for data processing systems.

The object is achieved in that in a phase-change memory for non-volatile storage of binary contents of the type mentioned, an acoustic generator is provided, which exposes the material to sound before or at least during the switching process.

Furthermore, the object is achieved by a method for a phase-change memory for the non-volatile storage of binary contents of the type mentioned at the beginning in which sound is generated, to which the material is exposed before or at least during the switching process.

The disclosure is based on the principle that the transition from the amorphous to the crystalline phase of the phase-change material can be accelerated substantially with sound, that is to say with mechanical waves. The phenomenon of beta relaxation in phase-change materials is exploited here. The phenomenon of beta relaxation means that amorphous materials exhibit faster atomic or particle motions that differ in terms of the time scale from the typical relaxation processes. Current tests show that the switching process can be accelerated by about a factor of 10, i.e. by one order of magnitude. The affect of ultrasound therefore significantly accelerates the switching process.

In an advantageous embodiment, the sound generator of the phase-change memory is designed as an ultrasonic generator. This is because ultrasound has proven to be particularly suitable for accelerating the switching processes in phase-change materials.

In another advantageous embodiment of the phase-change memory, the ultrasonic generator has a piezoelectric unit. By means of a piezoelectric unit, which can also be designed as a piezoelectric layer, an ultrasonic field can be generated in a simple and known manner, which can then act on the phase-change material, in particular during the switching process.

In a further advantageous embodiment of the phase-change memory, control means are provided to enable variable adjustment of the frequency of the ultrasound. In this manner, the frequency can be optimized for the material used, for example. The control means can preferably adjust the frequency of the ultrasound depending on the temperature. The temperature of the phase-change material has a decisive influence on the switching process. It may be necessary here to match the temperature and the ultrasonic frequency in order to optimize the switching process.

In a particularly preferred embodiment of the phase-change memory for the non-volatile storage of binary contents, a plurality of phase stages of the material are provided between the amorphous and crystalline phase for multi-stage switching when storing contents.

In an advantageous embodiment of the method for a phase-change memory, ultrasound is generated, to which the material is exposed before or at least during the switching process. This is because ultrasound has proven to be particularly suitable for accelerating the switching processes in phase-change materials.

In an advantageous embodiment of the method for a phase-change memory for non-volatile storage of binary contents, the ultrasound is generated by a piezoelectric unit. The generation of ultrasound using a piezoelectric crystal is a technique familiar to those skilled in the art and is therefore well suited for use in such a method.

Further embodiments and advantages will become apparent from the subject matter of the subclaims and the drawing with the associated description. An exemplary embodiment is explained in more detail below with reference to the accompanying drawing. The invention is not intended to be restricted solely to the exemplary embodiment described below. It only serves to illustrate the invention in more detail.

BRIEF DESCRIPTION OF THE DRAWINGS

FIG. 1 shows the structure of a phase-change memory with an ultrasonic generator.

DETAILED DESCRIPTION

In FIG. 1, 10 denotes the phase-change memory. The phase-change memory 10 comprises a first electrode 12 and a second electrode 14. A layer 16 of a phase-change material 18 is provided between the electrodes 12, 14. The electrode 12, the phase-change material 18, and the electrode 14 form a first functional area 20 of the phase-change memory 10, which is indicated by a curly bracket. This first functional area 20 is arranged on an insulating layer 22 belonging to this functional area 20.

A second functional area 24, which is also identified by a curly bracket, comprises an ultrasonic generator 26. This second functional area 24 adjoins the insulating layer 22 of the first functional area 20. The ultrasonic generator 26 comprises a piezoelectric crystal layer 28, which is controlled by two further electrodes 30, 32. An insulating layer 33 and a third functional area 34 adjoin the piezoelectric crystal layer 28.

The third functional area 34 comprises a heating layer 36 and two electrodes 38, 40. The third functional area is indicated by an additional curly bracket. The heating layer 36 is operated via the two heating electrodes 38, 40. This third functional area comprises a silicon oxide layer 42 and adjoins a final substrate layer 44.

The electrodes 12, 14 switch the phase-change material 18 depending on the current pulse and its duration.

The phase-change memory 10 exploits the fact that the phase-change material 18 has different electrical properties in the amorphous phase and in the crystalline phase. The electrical resistance is significantly greater in the amorphous state than in the crystalline state of the phase-change material 18. A current pulse is applied to the phase-change material 18 of the phase-change memory 10 via the two electrodes 12, 14. When a relatively high and short current pulse is applied to the phase-change material 18, it changes from the crystalline to the amorphous phase. After the end of the current pulse, the phase-change material 18 cools down very quickly. The phase-change material 18 remains in the amorphous state and does not return to the crystalline phase.

The phase-change material 18 returns from the amorphous state to the crystalline state by exposing it to a relatively low current pulse for a longer period of time. The process of switching from the amorphous to the crystalline state can thus be reversed based on the duration of the current pulse. As a result of the longer pulse duration, the amorphous material is heated to a temperature above the crystallization temperature and is maintained at this temperature until crystallization takes place. The process can be accelerated by applying ultrasound to the phase-change material 18 before or at least during the individual switching processes. With the piezoelectric layer 28, the ultrasonic generator 26 generates an ultrasonic field, which is matched to the phase-change material 18 and which acts on the phase-change material 18 and stimulates it accordingly. This accelerates the switching process of the phase-change material 18 considerably. Since the switching process of the phase-change material 18 is temperature-dependent in particular, the ultrasound is absorbed differently depending on the temperature. Control means, which are not shown here, are therefore provided that optimize the frequency of the ultrasound with respect to the temperature of the phase-change material 18.

The binary information contained by such a phase-change memory 10 is read by applying a voltage, for example across the electrodes. Depending on the state—amorphous or crystalline—of the phase-change material 18, a different current will flow, which is then utilized for reading. A binary state can thus be determined based on the resistance of the phase-change memory 10. The crystalline state is defined to be a binary "one", and the amorphous state is defined to be a binary "zero".

LIST OF REFERENCE SIGNS

10 Phase-change memory
12 First electrode
14 Second electrode
16 Layer
18 Phase-change material
20 First functional area
22 Insulating layer
24 Second functional area
26 Ultrasonic generator
28 Piezoelectric crystal layer
30 Electrode for ultrasonic generator
32 Electrode for ultrasonic generator
33 Insulating layer
34 Functional area
36 Heating layer
38 Electrode for heating layer
40 Electrode for heating layer
42 Silicon oxide layer
44 Substrate

The invention claimed is:

1. A phase-change memory (10) for non-volatile storage of binary contents,
    wherein the phase-change memory (10) stores the binary contents electrically and/or optically in a non-volatile manner by locally switching a material (18) between an amorphous and a crystalline phase,
    wherein a state with respect to an electrical conductivity of the material (18) and/or reflection properties of the material (18) determines an information content of the phase-change memory (10), and
    wherein a sound generator is provided, which exposes the material (18) to sound before or at least during the switching.

2. The phase-change memory (10) for the non-volatile storage of binary contents according to claim 1,
    wherein the sound generator is designed as an ultrasonic generator (26).

3. The phase-change memory (10) for the non-volatile storage of binary contents according to claim 2,
    wherein the ultrasonic generator (26) has a piezoelectric unit (28).

4. The phase-change memory (10) for the non-volatile storage of binary contents according to claim 1,
    further comprising control means for variably adjusting a frequency of the sound.

5. The phase-change memory (10) for the non-volatile storage of binary contents according to claim 4,
    wherein the sound is an ultrasound, and
    wherein the control means adjusts the frequency of the ultrasound depending on a temperature and/or material.

6. The phase-change memory (10) for the non-volatile storage of binary content according to claim 1,
    wherein a plurality of phase stages of the material (18) are provided between the amorphous and crystalline phase for multi-stage switching when storing content.

7. A method for storing non-volatile binary contents in a phase-change memory (10),
    wherein the phase-change memory (10) stores the binary contents electrically and/or optically in a non-volatile manner by locally switching a material (18) between an amorphous and a crystalline phase,
    wherein a state with respect to an electrical conductivity of the material (18) and/or reflection properties of the material (18) determines an information content of the phase-change memory (10), comprising:
    generating sound, and
    exposing the material to the sound before or at least during the switching.

8. The method according to claim 7,
    wherein the sound is generated by a piezoelectric unit (28).

9. The method according to claim 7,
    wherein generating sounds comprises generating ultrasound, and
    wherein exposing the material to the sound before or at least during the switching comprises exposing the material to the ultrasound.

10. The method according to claim 9,
    wherein the ultrasound is generated by a piezoelectric unit (28).

* * * * *